(12) United States Patent
Taylor

(10) Patent No.: US 11,303,304 B2
(45) Date of Patent: *Apr. 12, 2022

(54) RECEIVER RECEIVING A SIGNAL INCLUDING PHYSICAL LAYER FRAMES, AND INCLUDING A CONVOLUTIONAL DEINTERLEAVER AND A DEINTERLEAVER SELECTOR

(71) Applicant: SONY CORPORATION, Tokyo (JP)

(72) Inventor: Matthew Paul Athol Taylor, Ringwood (GB)

(73) Assignee: SATURN LICENSING LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/198,921

(22) Filed: Nov. 23, 2018

(65) Prior Publication Data

US 2019/0140664 A1 May 9, 2019

Related U.S. Application Data

(63) Continuation of application No. 14/780,303, filed as application No. PCT/GB2014/050971 on Mar. 27, 2014, now Pat. No. 10,177,789.

(30) Foreign Application Priority Data

Apr. 2, 2013 (GB) .................................... 1305943

(51) Int. Cl.
*H03M 13/27* (2006.01)
*H03M 13/23* (2006.01)
(Continued)

(52) U.S. Cl.
CPC ....... *H03M 13/2732* (2013.01); *H03M 13/23* (2013.01); *H03M 13/2792* (2013.01);
(Continued)

(58) Field of Classification Search
CPC ............. H03M 13/2732; H03M 13/23; H03M 13/2792; H03M 13/2782; H03M 13/2789; H03M 13/6508; H04L 1/0045
See application file for complete search history.

(56) References Cited

U.S. PATENT DOCUMENTS 6,151,690 A 11/2000 Peeters
6,542,478 B1 4/2003 Park
(Continued)

FOREIGN PATENT DOCUMENTS

EP 0 856 949 8/1998
EP 0 892 501 1/1999

OTHER PUBLICATIONS

International Search Report dated May 30, 2014 in PCT/GB2014/050971 filed Mar. 27, 2014.
(Continued)

*Primary Examiner* — Cynthia Britt
*Assistant Examiner* — Sazzad Hossain
(74) *Attorney, Agent, or Firm* — Oblon, McClelland, Maier & Neustadt, L.L.P.

(57) ABSTRACT

A receiver is arranged for receiving a signal comprising an interleaved symbol stream. The receiver comprises a convolutional deinterleaver comprising a plurality of delay portions each of which is arranged to delay symbols from the symbol stream from an input to an output by a different amount, the delay portions being arranged in a sequence. An input selector is configured to input the symbols from the symbol stream to the delay portions so that successive symbols are input in accordance with the sequence of the delay portions. An output selector configured to read the symbols from the delay portions by successively selecting the symbols from the outputs of the delay portions in
(Continued)

accordance with the sequence of the delay portions to form a deinterleaved symbol stream.

29 Claims, 13 Drawing Sheets

(51) Int. Cl.
*H04L 1/00* (2006.01)
*H03M 13/00* (2006.01)
(52) U.S. Cl.
CPC ....... *H04L 1/0045* (2013.01); *H03M 13/2782* (2013.01); *H03M 13/2789* (2013.01); *H03M 13/6508* (2013.01)

(56) References Cited

U.S. PATENT DOCUMENTS

| | | | | |
|---|---|---|---|---|
| 6,546,520 | B1* | 4/2003 | Cameron | H03M 13/00 |
| | | | | 714/701 |
| 6,697,993 | B1* | 2/2004 | Lopez | H04L 1/0065 |
| | | | | 714/755 |
| 7,444,556 | B2 | 10/2008 | Welborn et al. | |
| 7,549,093 | B2 | 6/2009 | Heise | |
| 7,945,780 | B1 | 5/2011 | Flynn et al. | |
| 10,177,789 | B2* | 1/2019 | Taylor | H03M 13/2732 |
| 2003/0097621 | A1* | 5/2003 | Xin | H03M 13/2732 |
| | | | | 714/701 |
| 2005/0280742 | A1* | 12/2005 | Jaffe | H04N 5/455 |
| | | | | 348/726 |
| 2006/0153311 | A1 | 7/2006 | Xue et al. | |
| 2007/0157060 | A1 | 7/2007 | Ganga et al. | |
| 2008/0172593 | A1 | 7/2008 | Rainish | |
| 2008/0276138 | A1 | 11/2008 | Flynn et al. | |
| 2009/0180034 | A1* | 7/2009 | Treigherman | H03M 13/2732 |
| | | | | 348/726 |
| 2009/0300300 | A1* | 12/2009 | Treigherman | H04L 1/0052 |
| | | | | 711/157 |
| 2010/0149961 | A1* | 6/2010 | Lee | H04L 5/0007 |
| | | | | 370/204 |
| 2010/0189162 | A1* | 7/2010 | Yoshimoto | H03M 13/27 |
| | | | | 375/141 |
| 2011/0113305 | A1 | 5/2011 | Liu et al. | |
| 2011/0299628 | A1* | 12/2011 | Ko | H04L 27/2618 |
| | | | | 375/298 |

OTHER PUBLICATIONS

Great Britain Search Report dated Sep. 19, 2013 in GB1305943.1 filed Apr. 2, 2013.
"VDSL2- Seamless Depth Change for the Generalized Convolutional Interleaver: HH-030", Texas Instruments, Inc., ITU-T Draft; Study Period 2005-2008, International Telecommunication Union, vol. 4/15, Jan. 17, 2005, pp. 1-12, XP017529077.
"G.VDSL: VDSL2 Seamless DRR using a Dynamic Interleaver", Alcatel Bell, ITU-T Draft: Study Period 2005-2008, International Telecommunication Union, vol. 4/15, Nov. 29, 2004, pp. 1-13, XP017524813.
Office Action dated Jul. 31, 2017, in Taiwanese Patent Application No. 103104417 (with English-language Translation).

\* cited by examiner

RECEIVER RECEIVING A SIGNAL INCLUDING PHYSICAL LAYER FRAMES, AND INCLUDING A CONVOLUTIONAL DEINTERLEAVER AND A DEINTERLEAVER SELECTOR This application is a continuation Application of U.S. application Ser. No. 14/780,303, filed Sep. 25, 2015, which is a National Stage application of PCT/GB2014/050971, filed Mar. 27, 2014, and claims priority to Great Britain Application No. 1305943.1, filed Apr. 2, 2013. The entire contents of the above-identified applications are incorporated herein by reference.

FIELD OF THE DISCLOSURE

The present disclosure relates to receivers and methods for receiving signals that comprise an interleaved symbol stream.

BACKGROUND OF THE DISCLOSURE

In digital communication systems reliable communication of data is important and a number of methods exist to improve the reliability, for example, error correction coding and data interleaving. Error correction coding allows errors in received data to be reliably corrected dependent on a number of errors in a code word being below a certain threshold. However, in the event of burst errors this threshold can be exceeded and the error correction code may fail to reliably correct the errors in the data. Interleaving of symbols and frames in a communication system assists in distributing burst errors between code words, therefore reducing the possibility that the error threshold of the error correction code will be exceeded. However, although interleaving is an important tool in modern communication systems, the benefits of interleaving often come at the cost of increased complexity and memory requirements at both a transmitter and a receiver.

SUMMARY OF THE DISCLOSURE

According to the present invention there is provided a receiver for receiving a signal comprising an interleaved symbol stream. The receiver comprises a convolutional deinterleaver comprising a plurality of delay portions each of which is arranged to delay symbols from the symbol stream from an input to an output by a different amount, the delay portions being arranged in a sequence. An input selector is configured to input the symbols from the symbol stream to the delay portions so that successive symbols are input in accordance with the sequence of the delay portions. An output selector is configured to read the symbols from the delay portions by successively selecting the symbols from the outputs of the delay portions in accordance with the sequence of the delay portions to form a deinterleaved symbol stream. A controller is configured to detect a discontinuity puncture in the interleaved symbol stream resulting from symbols being punctured from the interleaved symbol stream, and to identify symbols in the interleaved symbol stream affected by the discontinuity puncture, the identified symbols in the interleaved symbol stream being symbols which would be out of sequence in the deinterleaved symbol stream as a result of the discontinuity puncture. The controller is also configured to store the identified symbols, and to input the identified symbols into the delay portions to compensate for the discontinuity, wherein at least one of the delay portions is formed from one or more memories and at least one of the identified symbols is stored in the one or more memories of the delay portions, which would have been occupied by the symbols which had been punctured from the interleaved symbol stream.

The introduction of discontinuity punctures into an interleaved symbol stream and the detection of discontinuity punctures at the deinterleaver enable discontinuities such as interleaving frame transitions to be incorporated into convolutional interleaving without transmitting dummy symbols to ensure that symbols from consecutive interleaving frames are not interleaved. The identification of symbols affected by discontinuity punctures allows the correct deinterleaved stream to be output by the deinterleaver even though symbols have been punctured from the interleaved stream. In order to achieve the correct deinterleaved symbol stream whilst reducing the impact on latency through the interleaver, identified symbols are buffered or stored and then later read back into the delay portions of the deinterleaver to compensate for the discontinuity punctures. The present invention reduces memory requirements compared to using a single dedicated buffer for all stored symbols as it uses delay portion memory which is unoccupied due to the puncturing to store one or more of the identified symbols. This arrangement allows a deinterleaver to be reconfigured and interleaving frame lengths changed whilst maintaining a constant latency through the deinterleaver. The arrangement also utilises less memory than either than a block interleaver or a convolutional interleaver with a dedicated buffer to store all the identified symbols.

Various aspects and features of the present invention are defined in the appended claims and include claims to a method of receiving a signal comprising an interleaved symbol stream, a computer program for receiving a signal comprising an interleaved symbol stream, and a data processing apparatus for processing a signal comprising an interleaved symbol stream.

BRIEF DESCRIPTION OF THE DRAWINGS

Embodiments of the present invention will now be described by way of example only with reference to the accompanying drawings where like parts are provided with corresponding reference numerals and in which.

DESCRIPTION OF EXAMPLE EMBODIMENTS

Figure 1:
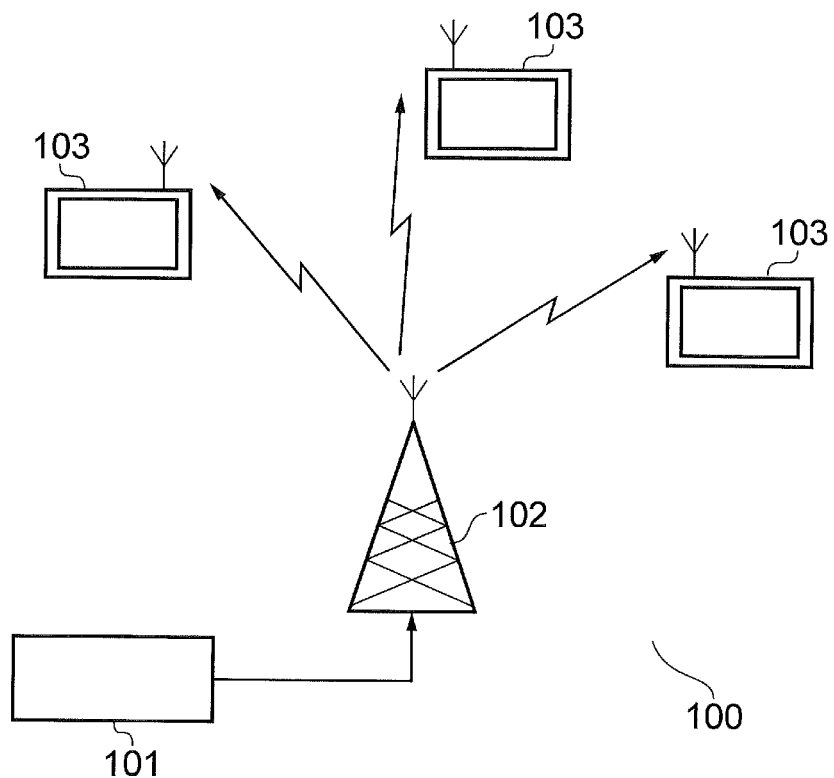
FIG. 1 provides a simplified diagram of a digital communication system.

FIG. 1 provides a block diagram of a simplified digital communication network 100. A network as illustrated by FIG. 1 may operate in accordance with any known communication standard such as the proposed Advanced Televisions Systems Committee 3 (ATSC3.0) standard or DVB-T standard for example. A core network 101 transmits a signal, such as a digital audio-visual signal representing television content, to a transmitter 102 that transmits the signal. The transmitted signal is received by the receivers 103, which in the case of a digital audio-visual signal may be a television set with a display, a receiver within a television set, a television receiver device or any other compatible device such as for example a mobile terminal (such as a cellular telephone) including or connectable to a television receiver device. The receiver is operable to receive the transmitted signal and provide the content represented by the signal to a display. Although FIG. 1 shows the wireless transmission of a signal, the transmission of the signal may take place over cables in a cabled communication system such as those that operate in accordance with ATSC Cable or DVB-C.

Figure 2:
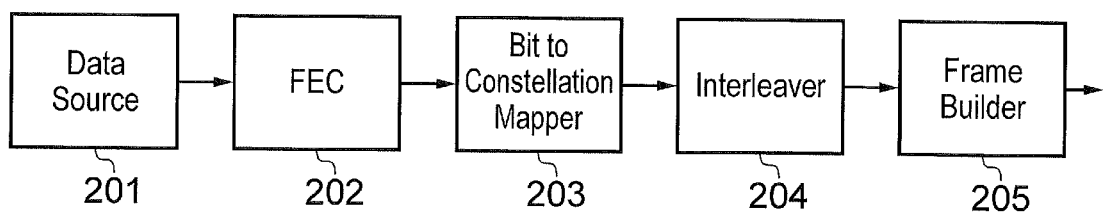
FIG. 2 provides a simplified block diagram of a transmitter suitable for use in the system of FIG. 1.

FIG. 2 shows a block diagram of example data processing elements which may form part of a transmitter chain of the core network 101 and the transmitter 102 of FIG. 1. In FIG. 2, the data source 201 generates data to be transmitted by the transmitter 102. The data source 201 feeds the data (possibly via intermediate elements) to a forward error correction (FEC) 202 encoder which performs error correction encoding of the data. The output of the forward error correction (FEC) encoder 202 may then be processed by other blocks, for example a constellation mapper 203, which maps groups of bits onto a constellation point, and is to be used for the conveying the encoded data bits. The outputs from the constellation mapper 203 are constellation points represented by real and imaginary components. The constellation points represent symbols formed from two or more bits depending on the modulation scheme used, which may be, for example, QPSK, QAM, 16QAM etc. The stream of symbols is then input to an interleaver 204 which may interleave the symbols across time and/or frequency. The interleaver 204 interleaves input symbols such that the symbols are distributed across one or more FEC code words, thereby creating a more uniform distribution of errors in cases where errors may occur in bursts in time or frequency. The interleaved symbols are received by a frame builder 205, which may form these symbols and symbols from other sources, which are used to convey information about the format of the transmission, into a set of symbols which will be referred to as a physical layer frame. However, in some examples the stream of symbols may have already been divided into frames or symbols allocated to frames prior to interleaving. A frame may then be processed by further blocks which modulate the frame onto for example a set of OFDM symbols, which are then used to modulate an RF signal for transmission over a radio channel or a cable channel. Although FIG. 2 depicts five elements, the core network 101 and transmitter 102 may also comprise a number of other elements common to the transmission of a digital signal, such as a multiplexer, a compression coder and signal amplifiers etc.

Figure 3:
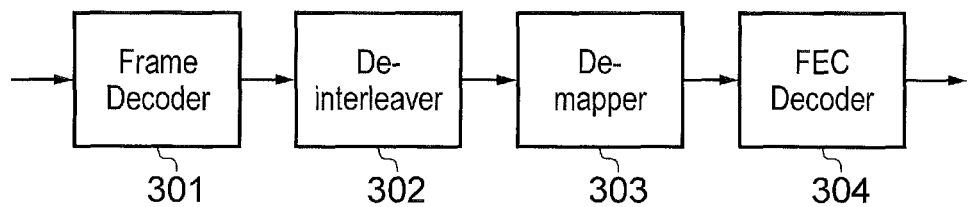
FIG. 3 provides a simplified block diagram of a receiver suitable for use in the system of FIG. 1.

FIG. 3 provides a block diagram of example data processing elements that may be comprised by the receivers 103 where the receivers 103 are operable to receive the signal transmitted by the transmitter 102 shown in FIGS. 1 and 2. The transmitted signal comprising the symbols are received by a frame decoder 301 via a suitable antenna and demodulation elements. The frame decoder 301 demultiplexes the frame and outputs a stream of interleaved symbols. These symbols are passed to a deinterleaver 302 which reverses the interleaving performed by the interleaver 204. The output of the deinterleaver then may pass through a demapper 303, which converts the symbols to a stream of bits. The data then passes to a FEC decoder 304 which attempts to correct any errors in the data. FIG. 3 illustrates a number of elements which may be found in a receiver such as those pictured in FIG. 1, however, the receiver 103 may also comprise a number of intermediate blocks not shown in FIG. 3 such as a demodulator, signal amplifier and other data processing elements common to digital receivers such as those required to provide audio-visual content to a display device.

Interleaving is often used in digital communication systems to improve the performance of forward error correcting codes. In many communication channels, errors often occur in bursts rather than in isolation or independently. If the number of errors within a code word exceeds the error-correcting code's capability, the error correction process may fail to recover the original code word. Interleaving ameliorates this problem by shuffling source symbols across several code words, thereby creating a more uniform distribution of errors. These code words are generally transmitted sequentially in time; hence the name "time-interleaving" because this stream of symbols is then interleaved in time. However, interleaving may also be done in the frequency domain so that in OFDM systems symbols may be distributed across different frequencies.

One method of performing interleaving is called block interleaving. This is used to implement the time-interleaving in many digital communication systems, for example DVB-T2 and ISDB-T. In a block interleaver blocks of symbols are interleaved and these blocks may be referred to as interleaving-frames. Another method of performing interleaving is convolutional interleaving. Convolutional interleaving is also known and used in digital communication systems, for example DVB-T. The advantage of a convolutional interleaver is that it generally uses half the amount of memory that is required for block interleaving, whilst giving similar performance. There are, however, disadvantages of convolutional interleaving when compared to block interleaving. For example, the data to be interleaved is continuous, rather than being naturally divided into discrete interleaving frames. This means that it may not be possible to change the interleaver parameters whilst the interleaver or deinterleaver is running. Secondly, a size of a convolutional interleaver needs to be related to other parameters of the communication system in which it is operating so the deinterleaver at the receiver can be synchronised with the interleaver at the transmitter.

Figure 4:
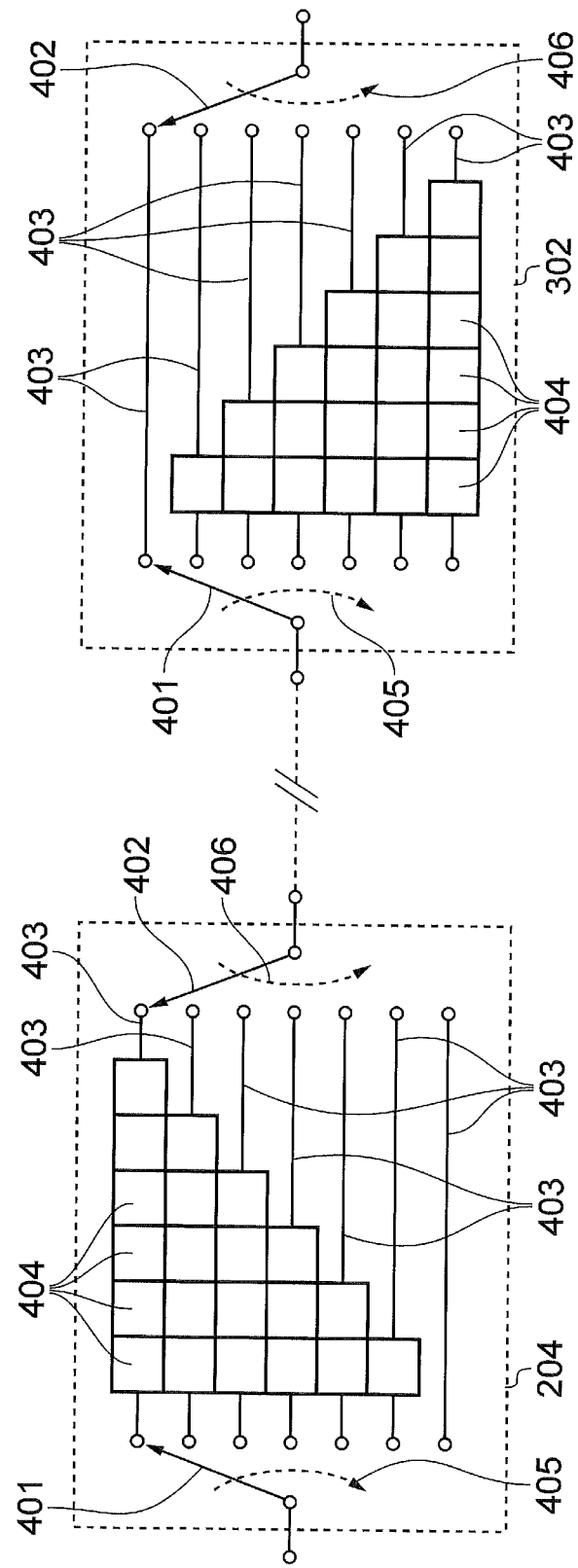
FIG. 4 provides schematic diagrams of an interleaver and deinterleaver pair suitable for use in the system of FIG. 1.

FIG. 4 illustrates the internal operation of a convolutional interleaver, such as the interleaver 204 depicted in FIG. 2, that would typically be found In the transmitter side of a digital communication system as depicted in FIG. 1. FIG. 4 also illustrates the internal operation of a convolutional deinterleaver, such as the deinterleaver 302 depicted in FIG. 3, that would typically be found In the receiver side of a digital communication system as depicted in FIG. 1. The interleaver 204 and the deinterleaver 302 each comprise an input selector 401, an output selector 402 and a plurality of delay portions 403, where the delay portions may also be referred to as interleaver/deinterleaver rows due to their layout in the interleaver and deinterleaver visualisations. The input selector 401 is operable to input symbols into a delay portion and the output selector 402 is operable to read out symbols from the delay portions. In some examples the input and output selectors 401, 402 may be synchronised such that they input and read out symbols from a same delay portion, however, they may also be unsynchronised such that they input and read out symbols from different delay portions. The selectors 401, 402 may for example become unsynchronised in the interleaver when output selector 402 does not read out a symbol from a delay portion but the input selector 401 continues to input a symbol to said delay portion.

The plurality of delay portions 403 are arranged to delay symbols by different amounts from when a symbol is input into a selected delay portion by the input selector 201 and read out from the selected delay portion by the output selector 402. At least one of the delay portions is made up of one or more memories or memory elements 404 where the delay introduced by a delay portion is partially dependent upon the number of memory elements the delay portion comprises. The number of symbols a delay portion is operable to store or delay at any one time is dependent on the number of memory elements the delay element comprises. In some examples the arrangement of the memory elements 404 may be said to form columns which are analogous to the interleaver/deinterleaver rows mentioned above. Each memory element may be associated with a memory location in an interleaver/deinterleaver memory which is operable to store a symbol input into a delay portion. The delay portions 403 are arranged in a sequence such as that illustrated in FIG. 4, where the delay portions 403 in the interleaver 204 are arranged in an order corresponding to decreasing delay i.e. decreasing number memory elements, and the delay portions 403 in the deinterleaver 302 are arranged corresponding to increasing delay i.e. increasing number of memory elements. However, the sequence of delay portions 403 may be arranged in any sequence depending upon the interleaving pattern or sequence required. The input selector 204 is configured to input symbols from an input sequence in accordance with the sequence of the delay portions 403 as shown by the dashed line 405. Likewise, the output selector 402 is configured to read symbols from the delay portions in accordance with the sequence of the delay portions 403 as shown by the dashed lines 406 to form a deinterleaved symbol stream.

The input to the convolutional interleaver 204 may be a stream of bits, symbols, blocks of bits or symbols etc. The term symbol used throughout this description includes all these cases. Each symbol from a symbol stream is input by an input selector 401, the selectors advance one delay portion downwards after the input of a symbol, wrapping round back to the top after the bottom delay portion. Each time a symbol is read out of or input to a delay portion 403 symbols remaining in the delay portions 403 are shifted towards the output selector 402 by one or more memory elements such that at least the memory element nearest to the input selector becomes vacant i.e. no longer contains useful data. During normal operation the next symbol from the interleaved or uninterleaved stream of symbols is input into the vacant memory element by the input selector 401. In the case of the delay portion which does not comprise any memory elements 404, the symbol input by the input selector 401 is immediately output or read out by the selector 402 before the selectors advance one delay portion downwards. Consequently, the delay between the input of a symbol from the stream of symbols into a delay portion and the output or reading-out of the same symbol from the delay portion is dependent upon the number of memory elements 404 in the delay portion and the frequency that symbols are input or read out from the delay portion 403. Although in the description above the selectors 401, 402 move in a downward direction, they may also move in an upwards direction after the input and reading-out of symbols from each delay portion 403. In some circumstances a symbol may be output, without the use of the output selector, from a delay portion in response to the input of a symbol to the delay portion by the input selector 401 and is not read directly into the interleaved/deinterleaved symbol stream. As can be seen in FIG. 4, as a result of the different delays introduced by the delay portions 403 of the interleaver 204, the stream of symbols input into the interleaver 204 or deinterleaver 302 will be read-out in a different interleaved or deinterleaved order, respectively, which is dependent on the number of delay portions, the delay introduced by each delay portion, and the sequence of the delay portions. As can also be seen in FIG. 4, the deinterleaver 302 has a structure that corresponds to that of the interleaver 204 such that the interleaved symbols inputted into the deinterleaver are read-out in the uninterleaved order of the stream of symbols that were input into the interleaver at the transmitter. Although in FIG. 4 the interleaver 204 and the deinterleaver 302 are illustrated as comprising rows and columns of memory elements, convolutional interleaving may also be represented via other visualisation. For example, they may be represented via the use of matrices where the size of a matrix and its elements determine the delay and therefore the interleaving/deinterleaving of the input/output symbol stream. Furthermore, the elements of the interleaver and deinterleaver described above and throughout the application may be implemented on a multipurpose or dedicated processor chip, where the functionality of the interleaver and deinterleaver is equivalent to that described but the implementation differs from the visualisations that are illustrated and described. For instance, the delaying of symbols and the input and output of symbols may be performed via memory address manipulation as opposed to the physical transfer of data representing symbols between memory elements and locations.

In some digital communications systems it may be necessary to reconfigure the interleaving/deinterleaving process from time to time. If a block interleaver and deinterleaver is used, then this is straightforward, because each interleaving frame is discrete so the reconfiguration can be done in between interleaving frames. In order to reconfigure a convolutional interleaver or deinterleaver however, it may necessary to shut down them down so they either contain no data or contain data from only a single interleaving frame. In some other systems it may be desirable to shut the time-interleaver down at regular intervals, for instance, after every interleaving frame. If the interleaving/deinterleaving process is shut down, then either symbols would remain in the interleaver 204 and deinterleaver 302 delay portions 403 and memory elements 404, or some method is required to overcome the fact that some delay portions 403 in the interleaver 204 and deinterleaver 302 would contain symbols whilst others did not. It can also be seen that when restarting a interleaving/deinterleaving process after shutting down and reconfiguring the process, then either data that remained in the interleaver and deinterleaver delay portions and memories prior to shutting down would be lost or some method is required to overcome the fact that some delay portions in the interleaver and deinterleaver would contain symbols whilst others did not. Losing data will often be unacceptable and therefore a method is required to overcome the fact that some delay portions in the interleaver and deinterleaver would contain symbols whilst others do not.

A first technique to overcome the fact that some delay portions in the interleaver 204 and deinterleaver 302 would contain symbols whilst others do not is to insert dummy symbols into the interleaver whilst continuing the interleaving/deinterleaving process until all the real data has passed through both the interleaver 204 and deinterleaver 302. A disadvantage to this approach is that bandwidth across the communications channel is wasted by transmitting these dummy symbols.

A second technique to overcome the fact that some delay portions in the interleaver 204 and deinterleaver 302 would contain symbols whilst others do not, is for a controller within the interleaver or deinterleaver to configure the selectors 401, 402 to skip over delay portions which contain no valid symbols during current iteration so that either a symbol is not read out from, or a symbol is not input to a delay portion during the iteration. This skipping may result in symbols that are out of sequence in the interleaved or deinterleaved stream of symbols being punctured from the interleaved symbol stream and transmitted at a later time. Alternatively, it may be viewed that dummy symbols have been introduced and it is these that are punctured from the interleaved symbol stream but are not transmitted at a later time. In either case, bandwidth across the communications channel is not wasted because no dummy symbols are transmitted through it and data symbols are only delayed. If the selectors 401, 402 skip over delay portions in response to symbol punctures or to puncture symbols from the transmitted stream, it is necessary for the interleaver 204 and deinterleaver 302 to be able to determine when it is necessary to do this. One method of doing this is for the interleaver 204 and deinterleaver 302 to store a flag to indicate whether each memory element 404 and its associated memory location contains valid or invalid data. A possible disadvantage of this is that extra memory is required to store this flag, which is a particular disadvantage in the receiver in a broadcast system because there will be many more receivers than transmitters and therefore the accumulated extra memory may be significant. An alternative method in accordance with the present disclosure is for the controller (s) to be able to calculate and detect when it is necessary for the selectors 401, 402 to skip over delay portions which contain no valid symbols or when there is no symbol which should be input into the delay portion at that time or iteration. For example, the controller may be configured to detect when a discontinuity puncture results from a discontinuity in the interleaved symbols or a discontinuity in the symbols to be interleaved. After detection the controller can then identify symbols in the interleaved or deinterleaved symbol stream which are affected by the discontinuity or discontinuity puncture. The aforementioned discontinuities will normally arise from a transition between frames in the uninterleaved input symbol stream or when the interleaver and deinterleaver and required to be reconfigured and therefore the symbol stream separated into interleaving frames where symbols are not interleaved across the frames. The points at which the interleaver 204 or deinterleaver 302 skip whilst shutting down the interleaving/deinterleaving process i.e. just before a discontinuity such as a interleaving frame transition, will be referred to as shutdown punctures; the points at which the interleaver or deinterleaver skips whilst starting up the interleaving/deinterleaving process i.e. after a discontinuity such as a interleaving frame transition, will be referred to as startup punctures. Shutdown punctures may occur when a symbol stream is divided into interleaving frames and a symbol is not transmitted because it forms part of the next interleaving frame and it is required that all symbols from the current interleaving frame are transmitted prior to the transmission of the next interleaving frame. Similarly, a startup puncture may occur when two successive interleaving frames are transmitted separately i.e. not interleaved between each other, and the symbols in the interleaved stream that would belong to the preceding interleaving frame are not transmitted interleaved with the symbols from the subsequent interleaving frame. As mentioned above, punctured symbols are punctured from their normal position in the interleaved symbol stream and transmitted at a subsequent time. Consequently, even with puncturing, symbols are transmitted at the same rate and with the same latency but in an amended order to ensure separation between the symbols of two successive interleaving frames. It is the role of the controller in the interleaver to ensure the correct symbols are punctured to account for a discontinuity and the effects of the puncturing compensated for i.e. transmit at a later time those symbols which do not belong to the current interleaving frame. Correspondingly, it is the role of the controller in the deinterleaver to take account of or compensate for the amended order of transmission of the symbols when reconstructing the uninterleaved symbol stream.

Referring again to FIG. 4, in order to calculate when a delay portion 403 should be skipped over it is necessary to number the delay portions 403 sequentially and number the iterations of the selectors 401, 402 through the sequence of delay portions in the following manner $$N_{por}=0,1,2\ldots N_{pors}-1$$

$$N_{iter}=0,1,2\ldots \infty$$

where $N_{pors}$ is the total number of delay portions 403 in the interleaver 204 or deinterleaver 302 and the number of symbols from the stream of symbols left in the current interleaving frame is $N_{frame}$.

Using the variables defined above it is possible to calculate a reference number, also known as the ordinal number, for each input and output symbol and/or each memory element 404 of the interleaver 204 or deinterleaver 302 relative to the time that the startup process began and the place of the symbol in the uninterleaved stream. When the selectors move in a downwards direction relative to the delay portions as shown in the Figures, the reference number may be given by $$N_{ref}=(N_{iter}-N_{pors}+1)N_{pors}+(N_{pors}+1)N_{por}.$$

The reference number is the position of the symbol in the uninterleaved symbol stream i.e. the position of symbol in the stream before interleaving or after deinterleaving, or the position of the symbol in a stream if it were stored in a particular memory element in the deinterleaver 302 or interleaver 204. Consequently, if a reference number is less than 0, then a startup puncture discontinuity has been detected because the symbol would belong to the preceding interleaving frame and the relevant selector(s) 401, 402 should move on to the next delay portion:

$$N_{ref}<0$$

If the reference number is greater than or equal to $N_{frame}$ then a shutdown puncture discontinuity has been detected because the symbol would belong to the subsequent interleaving frame and the relevant selector(s) 401, 402 should move on to the next delay portion:

$$N_{ref} \geq N_{frame}$$

In this way startup and shutdown punctures can be detected without having to store a flag for each memory location or element in order to indicate whether the symbol and or memory element is valid or invalid. In some examples the symbols and/or the memory elements may be allocated reference numbers and a discontinuity detected and compensation introduced when the reference numbers do not correspond to each other. In other examples the reference numbers of symbols may be compared to what should be expected during the current iteration and compensation introduced in the form of skipping the input or output of symbol from a delay portion(s) when a discrepancy between the reference numbers is detected. In yet another example, symbols affected by a discontinuity or puncture may be identified via a comparison between their reference number or the reference number of the memory element they are associated with, and those of other symbols in the uninterleaved or interleaved symbol stream. For instance, via a comparison between a symbol's reference number and the reference number of a symbol expected to be associated with a particular memory element in a selected delay portion.

In examples where the memory elements are allocated reference numbers, if the reference number associated with a memory element from which a symbol is to be read from or input to is either $N_{ref}<0$ or $N_{ref} \geq N_{frame}$; then a puncture will have been detected. Compensation is then introduced in the form of skipping the input or skipping the output of a symbol to or from the delay portion(s) in which the memory element is located. For instance, if a memory element in the deinterleaver has a reference number of 78 associated with it but the interleaving frame has only 70 symbols remaining, the next symbol in the interleaved symbol stream will not be input into the memory element because the selector will skip over the delay portion containing the memory element.

Whilst the interleaver 204 or deinterleaver 302 is running, a count of the number of symbols output from the interleaver 204 or deinterleaver 302 can be maintained. Once this is equal to $$N_{frame}-1$$

then all the symbols of the current frame have been output.

Similarly, if the selectors 401, 402 move in the opposite direction i.e. an upwards direction relative to the delay portions in the Figures, a similar expression for $N_{ref}$ can be found:

$$N_{ref}=(N_{iter}-N_{por})N_{pors}+N_{por}$$

where the same expressions for detecting startup and shutdown punctures can be used.

In reality, we may wish to run the interleaver 204 or deinterleaver 302 for a long time, having started it before the time that it would be shut down was known. The technique described above can be used for this situation in order to detect the startup punctures, because it is not necessary to know the length of the interleaving frame $N_{frame}$ in order to detect startup punctures. However, the above technique needs to be adapted to enable shutdown punctures to be detected, given that the length of the interleaving frame $N_{frame}$ is not known. In this situation, we define some arbitrary time before the shutdown process has started and at which the selectors are at portion 0 ($N_{por}=0$). We define $N_{iter}$ to be 0 at this time and we define $N_{frame}$ to be the number of symbols remaining in the interleaving frame. Then the method described above can be used to detect the shutdown punctures.

As already stated, in some examples it may be necessary for the selectors in the interleaver 204 and the deinterleaver 302 to be synchronised. If the interleaver 204 has been started before the receiver 103 was switched on, then the receiver 103 needs to know the correct position of the selectors 401, 402. This may be achieved by the transmitter signalling the position of the selectors 401, 402 at the start of each frame in some form of selector synchronisation data or signalling that appertains to that frame. Then, during its acquisition process, the receiver 103 can decode that signalling in order to set the selector 401, 402 in the correct position. Once the deinterleaver 302 is synchronised with the interleaver 204, then this signalling does not need to be decoded.

It is also likely the receiver 103 needs to be able to synchronise to the output of the deinterleaver 302. For example, if the symbol stream were divided into FEC-frames for error correction purposes, the receiver 103 would need to be able to determine the position of the start of one of those FEC-frames. This may be done by the transmitter 102 signalling the number of symbols that the deinterleaver 302 will output during that frame before some known reference point, for example the start of a FEC-frame, will be output from the deinterleaver 302.

It may be desirable that the latency of a communications system 100 is constant. For example, in a broadcast system, the original video or audio signal will be a continuous stream which needs to be output or displayed as such by a receiver 103. When the selectors 401, 402 of the interleaver 204 or deinterleaver 302 skip a delay portion 403 and therefore do not input and or read out symbols from a delay portion, other symbols will be affected and the rate of symbols input and output will be affected. Consequently the latency through the system may be affected because a symbol expected to be in the symbol stream has been punctured from the stream in order to be transmitted at a later time. Therefore, in many communications systems buffering of symbol(s) affected by a discontinuity puncture will be required in order to keep the latency constant and compensate for the effects of the discontinuity puncture.

In the interleaver 204, if a shutdown puncture is determined then the current symbol may not be read out by the output selector 402 and the current delay portion skipped so that the current symbol is not read out into the interleaved symbol stream. However, there will be data that is required to be input to the current delay portion. Therefore, the current symbol may be outputted in an alternative manner and stored somehow in a buffer. Likewise, in the deinterleaver 302, if a shutdown puncture is determined, then the current symbol from the interleaved symbol stream will not be input to the current delay portion and so this input data is required to be stored somehow in a buffer. This is particularly important because in many communications systems, and particularly a broadcast system, the input data will be a continuous, unstoppable stream and therefore symbols will either have to be stored or transmitted. In some examples the input symbols in the interleaver may be required to be stored depending on the input and reading out processes, and likewise in some examples the output symbols from the deinterleaver may be required to be stored depending on the input and reading out processes.

Deinterleaver

Figure 5:
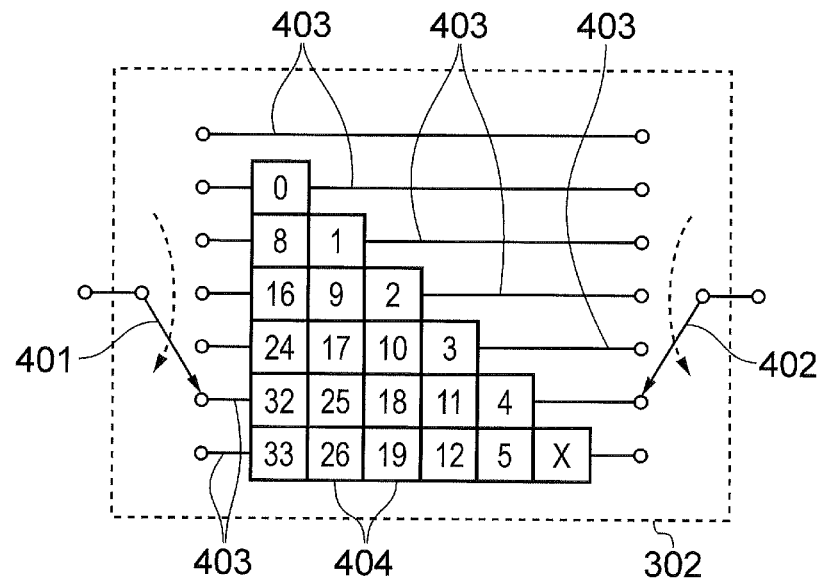
FIG. 5 and FIG. 6 provide schematic diagrams of a deinterleaver in accordance with an embodiment of the present disclosure.

FIG. 5 shows the deinterleaver 302 shortly before a shutdown puncture will occur. The symbol in each memory element 404 are numbered to indicate their reference number in the uninterleaved stream.

Consequently, the controller in the deinterleaver identifies the symbols which would be affected by the puncture where the puncture has been determined by using the expressions given above and the location of the memory elements that the symbols would be input into. For example, the controller may identify symbols whose reference number would be out of sequence in the uninterleaved symbol stream if they were to be read out as normal. Alternatively, the controller may identify a memory element and delay portion where a punctured symbols would normally have been input and skip the inputting of a symbol to the identified delay portion. This may be because the reference number of the memory element exceeds $N_{frame}$ and the symbol originally destined for this memory element will be received at a later time due to a shut down puncture at the interleaver. In FIG. 5, the symbol with index 0 in the second delay portion is the first symbol after the position of the shutdown was signalled and the symbol with index X in the last or bottom delay portion is a symbol before that position. The next symbol in the input stream in this case also has the index X and so this needs to be output before the symbol with index 0.

Figure 6:
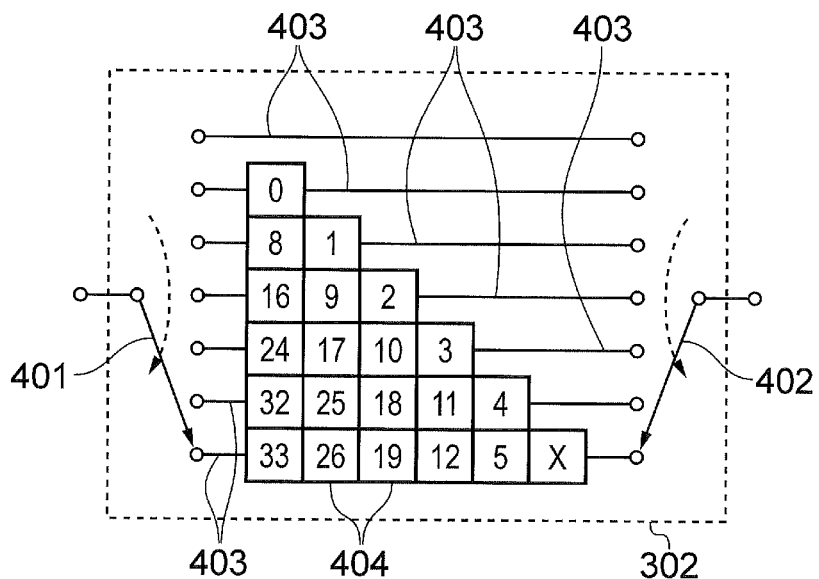

FIG. 6 shows the deinterleaver 302 one symbol later as a shutdown puncture occurs. It can be seen that the bottom delay portion needs to be shifted in order for the last symbol in the bottom delay portion to be read out because symbol X needs to be output before the symbol with reference number 0, otherwise the output stream will be different to the uninterleaved stream (because the symbol reference numbers will not be sequential). However, it can also be seen that the next input symbol (which also has the index X) should not be input to the bottom delay portion of the deinterleaver because the symbol which would have been intended for this delay portion has been punctured from the interleaved symbol stream and will be transmitted at a later point in time. If the next input symbol from the symbol stream were input into the bottom delay portion it will be output after the symbol with reference 0 and so the output stream will be different to the uninterleaved stream (because the symbol reference numbers will not be sequential). Therefore, because the input stream is continuous and unstoppable, the next input symbol needs to be stored somehow.

Figure 7:
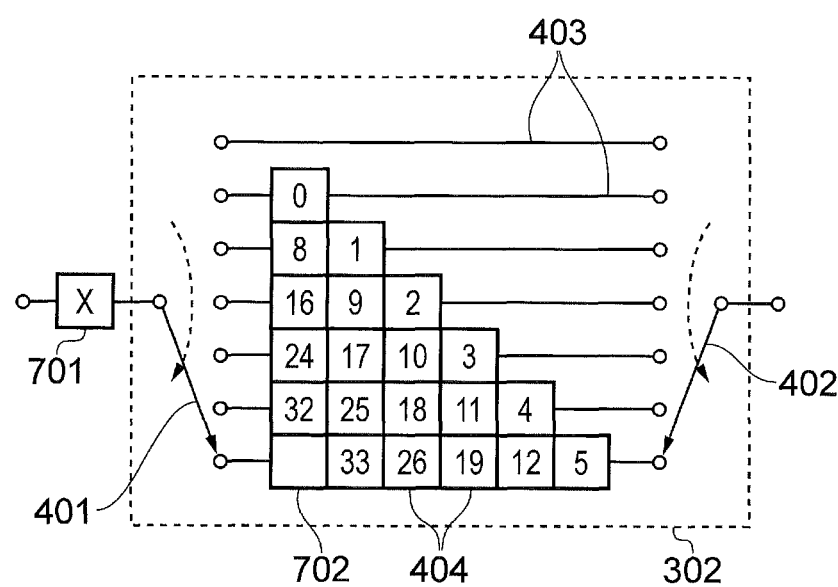
FIG. 7 to FIG. 12 provide schematic diagrams of a deinterleaver with an input buffer in accordance with an embodiment of the present disclosure.

FIG. 7 illustrates a method of storing the symbol from the interleaved stream which has not been input into a delay portion, where a buffer 701 is used at the input to the deinterleaver 302. The buffer 701 is represented by the new memory at the input, which contains the symbol X. As each shutdown puncture occurs the number of symbols stored in the buffer 701 increases. A possible disadvantage of this method is that extra memory is required to implement the buffer 701. This may be a particular disadvantage in the receiver 103 in a broadcast system because there will be many more receivers than transmitters or a in transceiver in a two-way communication system. In order to reduce the impact of this disadvantage, it is advantageous to limit the amount of memory required to implement this input buffer 701.

A technique in accordance with an example of the present disclosure is to limit the amount of memory required to implement the input buffer 701 is to reuse the deinterleaver memory elements 404 to implement the buffer 701. Referring again to FIG. 7, it can be seen that a memory element 702 in the bottom delay portion becomes free as the shutdown puncture occurs. Furthermore, it turns out that no more symbols will be input to the bottom delay portion during the current interleaving frame and so the leftmost memory element in the bottom delay portion is no longer required during this interleaving frame. This can be shown by considering the expression for the reference number $N_{ref}$ for the deinterleaver 302 with the selectors 401, 402 moving in a downward direction:

$$N_{ref}=(N_{iter}-N_{pors}+1)N_{pors}+(N_{pors}+1)N_{por}$$

The shutdown puncture is determined because the reference number $N_{ref}$ of the symbol which would be stored in the vacant memory element 702 had a puncture not occurred is greater than the (remaining) length of the interleaving frame $N_{frame}$, or equivalently, the reference number associated the memory element 702 is greater than the (remaining) length of the interleaving frame. It can be seen that for a fixed $N_{por}$ (e.g. the bottom delay portion in this case) and a fixed $N_{pors}$, on the next iteration $N_{iter}$ will have increased by 1 and so the value of $N_{ref}$ will necessarily be greater than on the current iteration. The shutdown puncture is determined because the reference number $N_{ref}$ is greater than the (remaining) length of the interleaving frame $N_{frame}$, consequently, a shutdown puncture will necessarily be determined for this delay portion on the next iteration and all subsequent iterations (because $N_{iter}$ always increases). It can also be seen that whenever a shutdown puncture is determined (thus requiring an input to a delay portion to be skipped), a memory element and corresponding memory location becomes no longer required.

Therefore, whenever a shutdown puncture is determined and a memory element 404 becomes unoccupied, the memory location associated with the unoccupied memory element can be used to implement a buffer 701 to store in input symbol that was not input into a particular delay portion.

Figure 8:
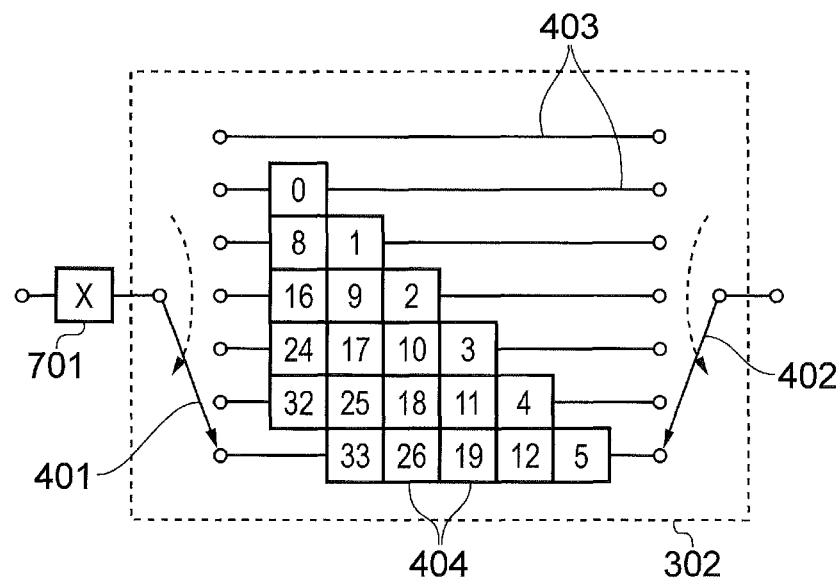

FIG. 8 shows the deinterleaver when the memory element 702 and its corresponding memory location have been moved to implement the buffer 701.

Figure 9:
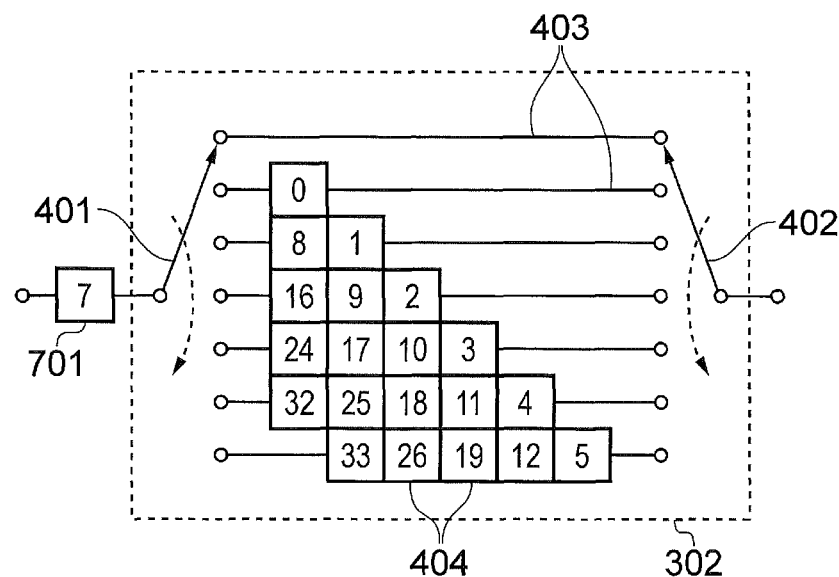

FIG. 9 illustrates the deinterleaver 302 when the next input symbol from the stream of interleaved symbols which has reference number 7 has been input. After reading out of the next symbol, the selector 401 will switch to the top delay portion of the deinterleaver 302 and so symbol X that was stored in the input buffer 701 will be read out immediately, which is what is required in order to recreate the uninterleaved stream correctly.

Figure 10:
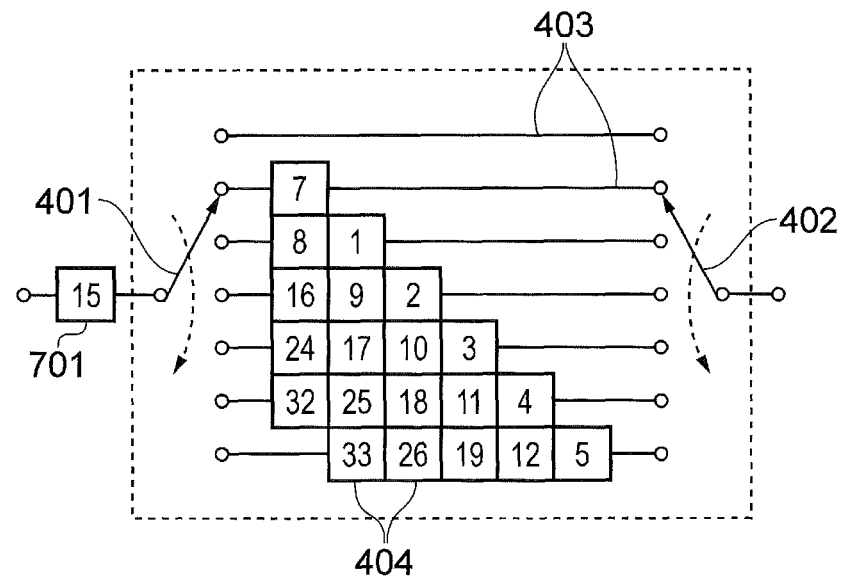

FIG. 10 illustrates the deinterleaver after the next symbol has been input, which has the reference number 15. This is stored in or written to the input buffer 701, after the symbol 7 previously in the input buffer is written to the deinterleaver 302 in order to compensate for the previous discontinuity puncture. It can be seen that, based on the reference numbers, the uninterleaved sequential stream of symbols will be recreated by the deinterleaver when the symbols are read out. The effects of puncturing symbols at the interleaver and the skipping of delay portions are therefore compensated for.

Figure 11:
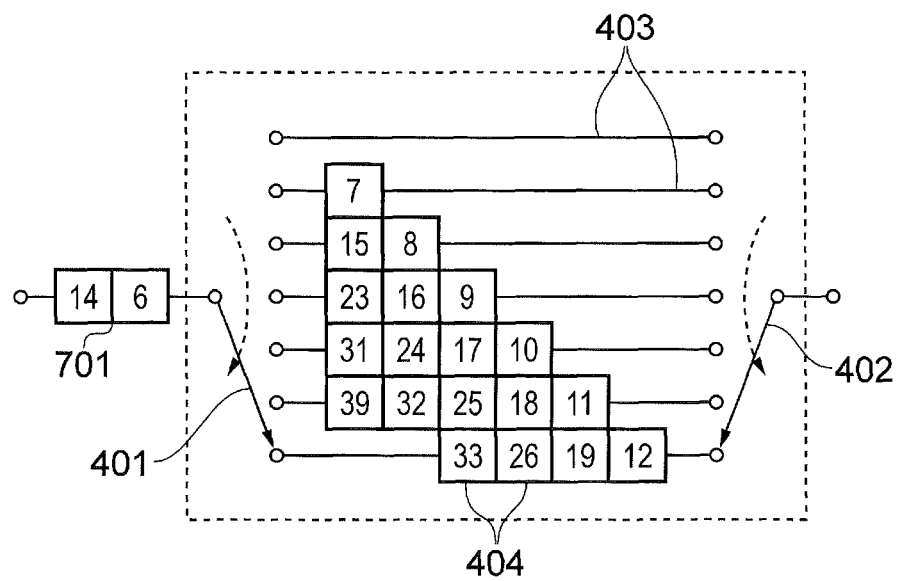

FIG. 11 shows the deinterleaver 302 after a next shutdown puncture such that another deinterleaver memory element and corresponding memory location are no longer required and become available to be used for implementing the input buffer 701. As is evident from FIG. 11, as each shutdown puncture occurs, a new memory element and its associated memory location is released from the deinterleaver 302 and the amount of memory required to implement the input buffer 701 increases by one memory location. Accordingly, the input buffer 701 can therefore be implemented using memory locations of memory elements 404 released from the deinterleaver 302. Consequently, the process of detecting discontinuity punctures, identifying and storing symbols affected by the discontinuity puncture and subsequently inputting the stored symbols into the delay portions to compensate for the discontinuity punctures can be carried out by a controller with little or no additional memory for symbol storage.

The reuse of the interleaver memory for the input buffer 701 described above results in an advantage that no additional memory for the storing of symbols is required beyond that of the deinterleaver memory itself when discontinuity punctures occur. This is particular advantageous when considering receivers in a system due to their lower cost and higher numbers compared to transmitters.

Consequently, as a result of the input buffer 701 being formed from the deinterleaver memory locations, the capacity of a digital communication system that involves interleaving can be maintained when there are discontinuities such as puncture discontinuities without increasing the memory requirement of the deinterleaver and hence the cost of the associated receiver. Furthermore, the performance and memory advantages of convolutional interleaving can be combined with the advantages of block/frame separation usually associated with block interleaving.

Figure 12:
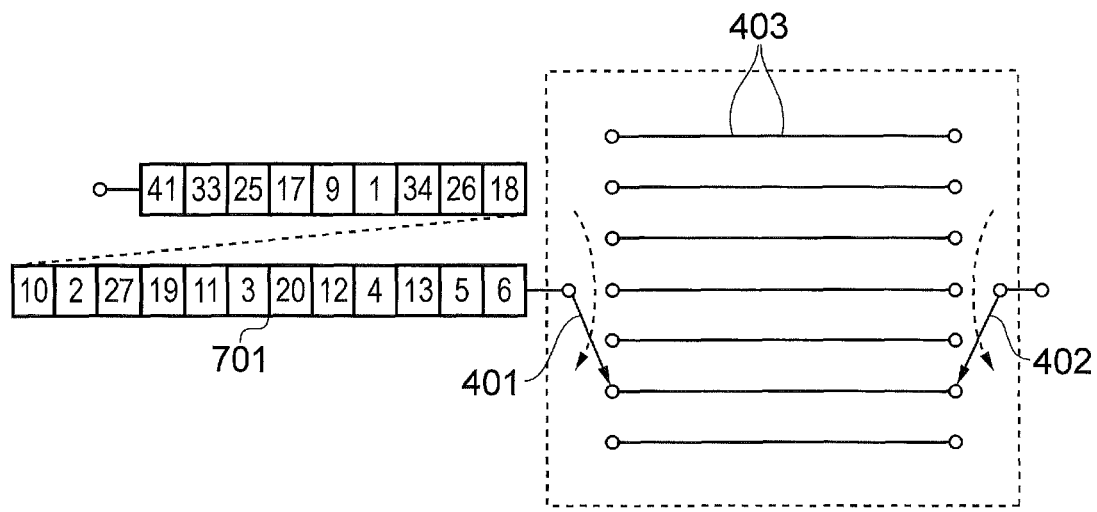

FIG. 12 shows the deinterleaver 302 as the last shutdown puncture occurs in a scenario where all the memory locations have been reused in the input buffer 701. By this time all the symbols in the input buffer 701 appertain to the next interleaving frame, where the next interleaving frame is the interleaving frame that followed the interleaving frame where the shutdown occurred. In order to enable the deinterleaving of the next frame the input buffer 701 and the symbols it stores may be reconfigured as another deinterleaver 302 such that the memory locations of the input buffer 701 are once again associated with memory elements 404 of the delay portions 403.

Figure 13:
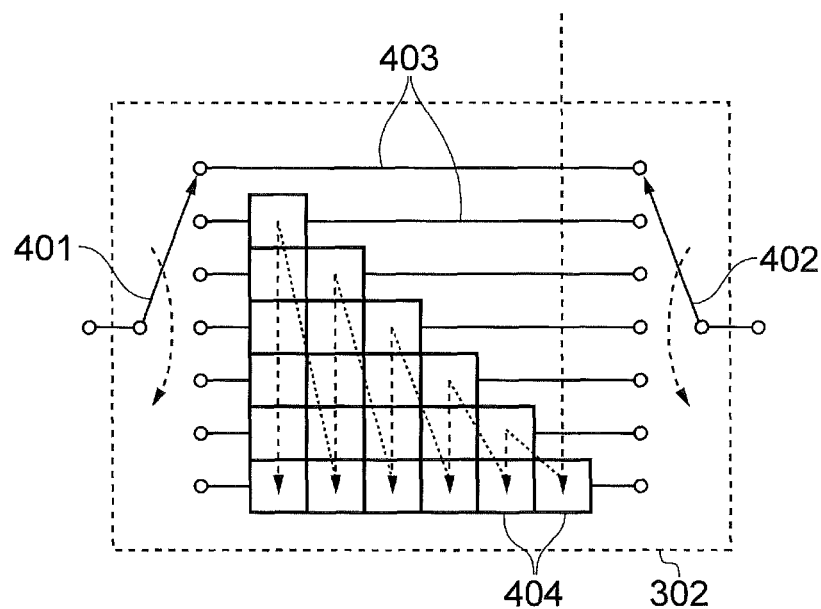
FIG. 13 provides a schematic diagram of an order of writing symbols into a deinterleaver in accordance with an embodiment of the present disclosure.

FIG. 13 illustrates the reconfiguration of the input buffer 701 into the deinterleaver 302 whilst simultaneously accounting for the startup punctures from the following interleaving frame. This may for example occur when the symbols from the current frame have been read out from the delay portions 403 and the stored symbols relate to the next frame. The reconfiguration comprises allocating the memory locations from the input buffer 701 right to left into the deinterleaver vertically from top to bottom, filling columns formed from memory elements from right to left. In some examples the process of reconfiguration may be considered to be inputting the stored symbols into the delay portions in accordance with the predefined sequence illustrated in FIG. 13. However, reconfiguration may also be achieved by reconfiguring memory mapping and the memory locations which are associated with each memory element and delay portion. The fact that this reconfiguration sequence may be predefined may reduce the computational burden on the controller when reconfiguration is required.

Figure 14:
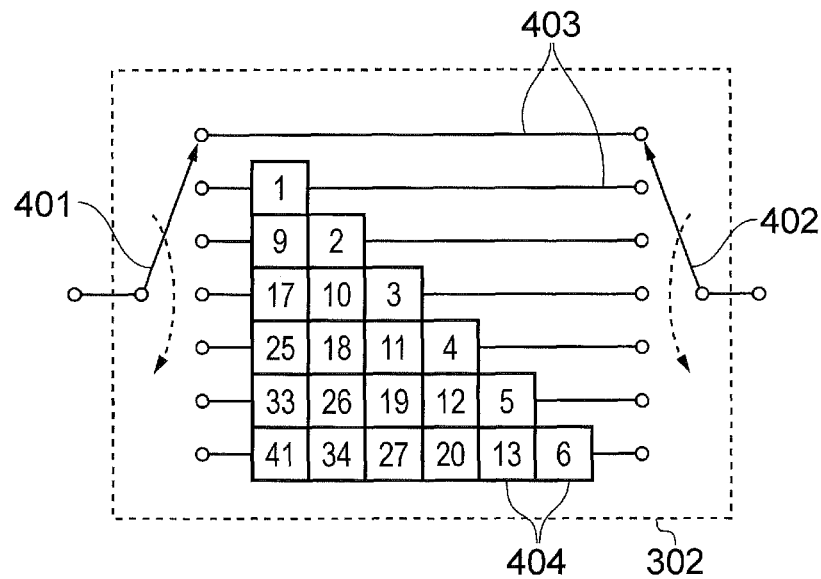
FIG. 14 provides a schematic diagram of a deinterleaver in accordance with an embodiment of the present disclosure.

FIG. 14 shows the deinterleaver 302 after the reconfiguration has been completed. The next symbol input will have reference number 0 and will be input and immediately read out of the top delay portion before symbol 1 in the second delay portion will be read. Consequently, it can be seen that the uninterleaved stream will be recreated.

Figure 15:
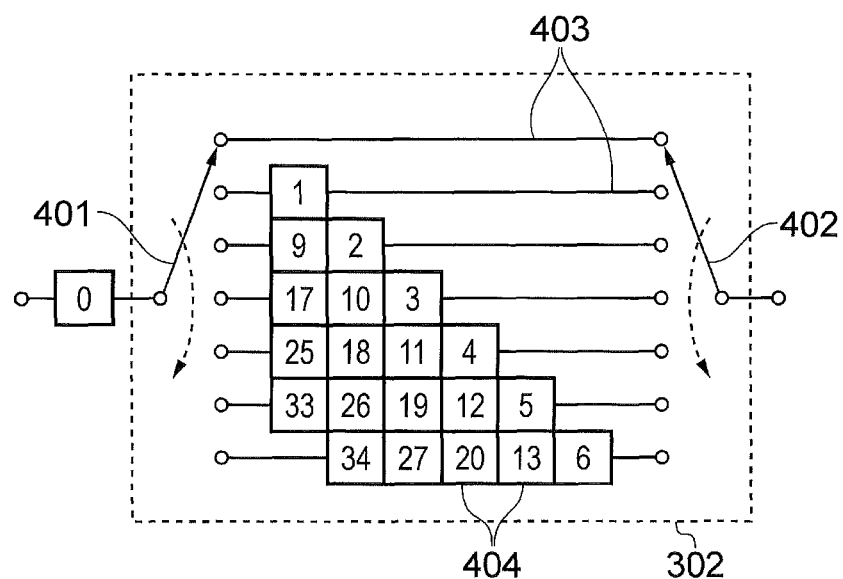
FIG. 15 provides a schematic diagram of a deinterleaver with an input buffer in accordance with an embodiment of the present disclosure.

FIG. 15 illustrates the deinterleaver 302 in an example of a scenario when the following interleaving frame is shorter than the sum of number of memory locations in the interleaver plus the number of memory locations in the deinterleaver. In this case shutdown punctures may need to be accounted for in the reconfiguration process. For example, in FIG. 15 symbol 0 should not be input into the bottom delay portion because it would be read out after symbol 1 and therefore the deinterleaved stream of symbols would be incorrect. The expressions given previously can be used to determine the occurrence of shutdown punctures during the reconfiguration process. In the case of the left most memory element in the bottom delay portion in FIG. 15, the reference number $N_{ref}$ will be greater than $N_{frame}$ and therefore this memory location associated with the memory element must remain as an input buffer memory location.

Memory Management

It is likely that the memory for the deinterleaver 302 already described would be implemented as part of a random access memory rather than as discrete memory locations such as flip-flops. In that case, rather than physically moving data between memory locations in the random access memory, it would be better to move the data virtually by controlling the address mapping. In this case, the following memory mapping functions $f_a$ and $f_i$ are required for the deinterleaver:

$$A_{RAM} = f_a(N_{por}, N_{column})$$

$$A_{RAM} = f_i(N_{buffer})$$

where $A_{RAM}$ is the address in the random access memory
$N_{por}$ is the delay portion number
$N_{column}$ is the column number
$N_{buffer}$ is the position in the input buffer The function $f_a$ is commonly known in the art because convolutional interleaving/deinterleaving is a known technique and so techniques for implementing such interleavers and deinterleavers in a random access memory are also commonly known.

Figure 16:
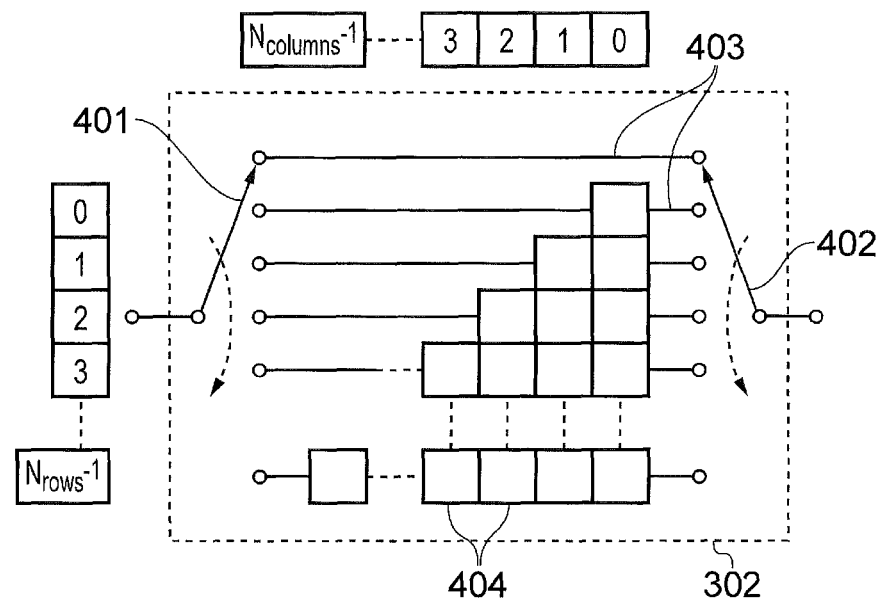
FIG. 16 provides a schematic diagram of a numbering of memory elements of a deinterleaver in accordance with an example of the present disclosure.

FIG. 16 illustrates a deinterleaver 302 where the numbering from top to bottom of the delay portions 403 and the numbering of the columns from left to right is shown. A suitable memory mapping function for the deinterleaver 302 of FIG. 16 is given below, where the columns are numbered right to left from 0 to $N_{columns}-1$ and the delay portions are numbered top to bottom from 0 to $N_{pors}-1$:

$$f_a(N_{column}, N_{por}) = \frac{N_{por}(N_{por}-1)}{2} + N_{column}$$

The function $f_i(N_{buffer})$ is dependent on the present application and so is not known in the art. The function $f_i(N_{buffer})$ also depends on the order in which memory locations become free (to be reused in the input buffer 701) which in turn depends on the position of the shutdown punctures. The position of the shutdown punctures depends on the length of the interleaving frame (or the number of symbols left in the interleaving frame once the end of the interleaving frame has been signalled), $N_{frame}$, and the number of delay portions 403 in the deinterleaver, $N_{pors}$. In order to simplify this relationship restriction is placed on $N_{frame}$ $$N_{frame} \bmod N_{pors} = 0.$$

In other words, $N_{frame}$ must be an integer multiple of $N_{pors}$. With this restriction applied, the function $f_i(N_{buffer})$ becomes:

$$f_i(N_{buffer}) = \frac{N_{por}(N_{por}-1)}{2} + N_{column}$$

$$N_{por} = N_{pors} - 1 - \left[ N_{buffer} - \frac{(N_{pors}-2-N_{column})(N_{pors}-1-N_{column})}{2} \right]$$

$$N_{column} = N_{pors} - \text{floor}\left[ \frac{\sqrt{1+8N_{buffer}}-1}{2} + 2 \right]$$

The function $f_i(N_{buffer})$ enables the random access memory address to be calculated for each memory location in the input buffer 701. Function $f_i(N_{buffer})$ is complicated and so may be difficult to implement, particularly in hardware.

Due to the operation of the input buffer 701 random access to the locations within it is not required. Instead, some kind of pointer or pointers may be maintained, which point to the position in the input buffer 701 from which symbols should be read or to which symbols should be written. Instead of manipulating these pointers in the linear domain 0 . . . $N_{buffer}$-1, the pointers can be manipulated in the domain 0 . . . $N_{column}$-1, 0 . . . $N_{pors}$-1.

Figure 17:
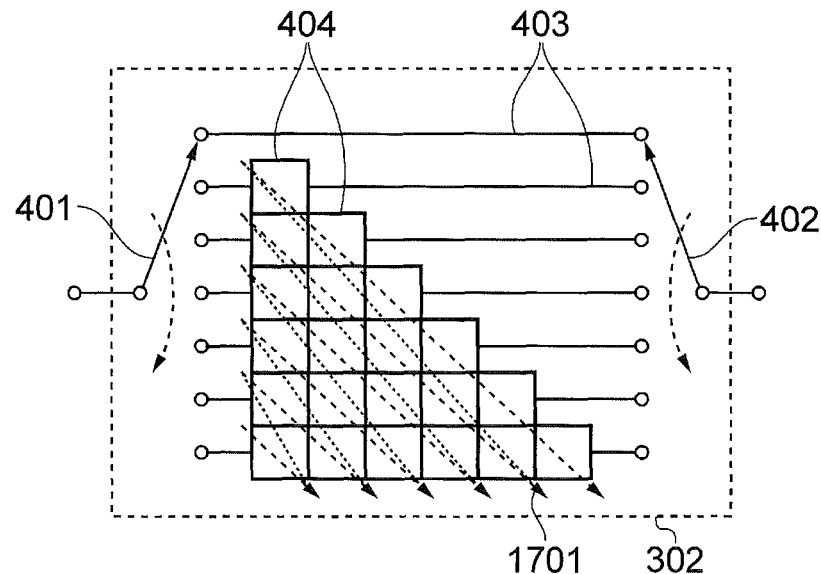
FIG. 17 provides a schematic diagram of an order in which memory elements become free in accordance with an example of the present disclosure.

FIG. 17 illustrates the order in which memory locations associated with memory elements 404 of the delay portions 403 become free. As long as the above restriction is adhered to, the manipulation of pointers in this domain is straight forward because the memory locations will become free in the order shown by the dashed line 1701.

Each delay portion 403 in the deinterleaver 302 is effectively a shift register where a symbol is shifted out the last memory element 404 of each delay element 403 at each iteration. If the deinterleaver 302 is implemented using flip-flops for example, then implementation of a shift register is well-known. However, if the deinterleaver 302 is implemented using a random access memory it is convenient to implement each delay portion as a ring buffer. A ring buffer is a known technique in which a shift register is implemented using a fixed block of memory of the same length as the shift register. A pointer is then maintained and the shifting of the shift register is simulated by first reading the data pointed to (which becomes the output of the shift register i.e. the a delay portion), then writing data to the same location (which is the input data to the shift register i.e. delay portion) and then moving the pointer to point to the next memory location whilst wrapping round to the first memory location if the pointer should be incremented beyond the end of the block of memory.

Figure 18:
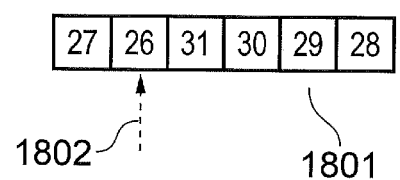
FIG. 18 provides a schematic diagram of a circular buffer in accordance with an embodiment of the present disclosure.

FIG. 18 illustrates a circular buffer 1801. A pointer 1802 points to the memory location containing the symbol with index 26 and when the next symbol arrives the symbol with index 26 would be read from the memory location pointed to by the pointer 1802. The new symbol would be written to that same memory location and then the pointer 1802 incremented so that it points to the memory location which contains the symbol with index 27. Thus the next output from the circular buffer 1801 will be the symbol with index 27 and the symbol that was written to the memory location pointed to in FIG. 18 would be output after five further read/write cycles. Thus, it can be seen that the circular buffer 1801 is implementing a shift register without data having to be physically shifted between memory locations. The pointer 1802 can be mapped to the linear random access memory address space using a function such as $f_a(N_{por}, N_{column})$ described above.

In some examples the input buffer 701 may be seen as a shift register that can expand or contract. The input buffer 701 is constructed using memory locations freed from the deinterleaver 302 and above it has been shown that the number of free memory locations available from the memory elements 404 of the deinterleaver 302 at any time is equal to the number required by the input buffer 701. In examples where the deinterleaver 302 is implemented using flip-flops the implementation of a shift register that can expand or contract is straight forward and the shifting of the shift register is well-known and new flip-flops can be added or removed using suitable multiplexing logic.

In other examples, the deinterleaver 302 may be implemented using a random access memory. Whilst the implementation of a shift register that can contract is straightforward, the implementation of a shift register that can expand is difficult when using random access memory. As described above, a convenient method of implementing a shift register using random access memory is to use a circular buffer. However, circular buffers are generally implemented as a buffer of constant size: a problem may arise if the circular buffer is to be expanded if the pointer is not pointing to one end of the block of memory used to implement the circular buffer. If it was required to expand the circular buffer 1801 shown in FIG. 18 and with the pointer 1802 in the position shown, a new memory location would be required between those containing symbols with indexes 26 and 31. As the block of memory used to implement the circular buffer is continuous, this may is difficult. However, the block of memory used to implement the input buffer 701 in may not be physically continuous but instead may be constructed using memory locations freed from the deinterleaver 302, consequently, the memory locations would be accessed using the methods described above, effectively making the memory locations continuous.

Another technique to implement the input buffer 701 would be to use a first-in first-out memory (FIFO) arrangement. A FIFO is a similar structure to a circular buffer except that two pointers need to be maintained, one for writing/input and one for reading/output. An advantage of using a FIFO rather than an expanding shift register is that a FIFO is effectively a shift register that can expand or contract as well as shift. However, implementing a FIFO requires a fixed amount of memory equal to its maximum size, whereas in this application this will not be the case if the memory used to implement the FIFO is that released from the deinterleaver when shutdown punctures are encountered.

Instead of using memory released from the deinterleaver 302 to implement the FIFO, another method of implementing a FIFO is to use a second block of memory. It was shown in FIG. 12 above that the maximum size of the input buffer 701 is equal to the number of memory locations in the deinterleaver 302. Therefore, without further adaptation, in order to implement the input buffer 701 using a FIFO based on a second block of random access memory, twice as much memory would be required as is required to implement the deinterleaver 701. As one of the main advantages of a convolutional interleaver is that it requires half the amount of memory as the equivalent block interleaver, it would seem that implementing the input buffer 701 using a FIFO based on a second block of random access memory would remove this advantage of using a convolutional interleaver completely. However, closer examination reveals that the amount of extra memory can be reduced. This is because the pattern of shutdown punctures is deterministic (especially if $N_{frame}$ mod $N_{pors}$=0), symbols from the next interleaving frame are not required to be shifted because they are not output from the input buffer 701 to the interleaver during the current interleaving frame, and the complexity in implementing an expanding shift register is caused by the need to be able to shift and expand the input buffer. However, if no shifting is required then implementation is more straightforward. Consequently, an amount of extra memory required to implement the input buffer 701 using a FIFO can be reduced by dividing the input buffer 701 input two sections: a first section is used to store symbols from the current interleaving frame, and a second section to store symbols from the next interleaving frame.

Figure 19:
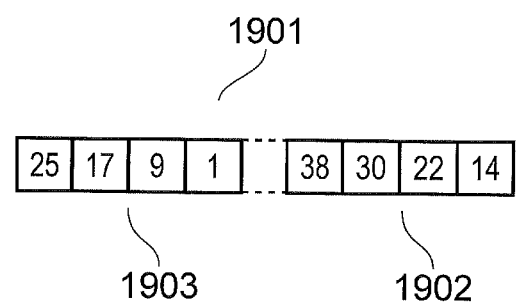
FIG. 19 provides a schematic diagram of a FIFO memory in accordance with an embodiment of the present disclosure.

FIG. 19 illustrates a two section buffer memory arrangement in accordance with an example of the present disclosure, comprising a first section 1902 for storing symbols from the current interleaving frame and a second section 1903 for storing symbols from the next interleaving frame. It is unlikely that the symbols in the second section 1903 will be required to be shifted and therefore a FIFO is only necessary to implement the first section 1902 as a FIFO. Whilst symbols from the current interleaving frame are passing through the first section 1902, it will be required to either expand or shift. Therefore, the maximum number of locations required to implement the first section 1902 is less than the number of symbols remaining in the interleaving frame after the first shutdown puncture. The maximum size of the first section 1902 will be reached when the number of shutdown punctures encountered is equal to the number of symbols remaining in the current interleaving frame because at that point the first section will be large enough to store all the remaining symbols in the current interleaving frame.

The maximum size of the first section can be calculated:

$$N_{max} = \sum_{k=1}^{floor(\frac{N_{pors}}{2})} k, \cong N_{addr}/4 \text{ for large } N_{pors}$$

where $N_{max}$—maximum length of the input buffer
$N_{pors}$—number of delay portions in the deinterleaver
$N_{addr}$—number of memory locations in the deinterleaver The second section 1903 may be implemented as a continuous block of memory, which is not required to be shifted and so its implementation using memory locations released from the deinterleaver 302 is straightforward. As long as the restriction $N_{frame}$ mod $N_{pors}$=0 is adhered to, memory locations will become free in the order shown in FIG. 17. Therefore, as symbols from the next interleaving frame are encountered they can be stored in memory locations released from the deinterleaver 302 in the order shown in FIG. 17. Furthermore, as a result of the separate memories and $N_{frame}$ mod $N_{pors}$=0, the configuration of the stored symbols from the next frame is greatly simplified as explained below.

Figure 20:
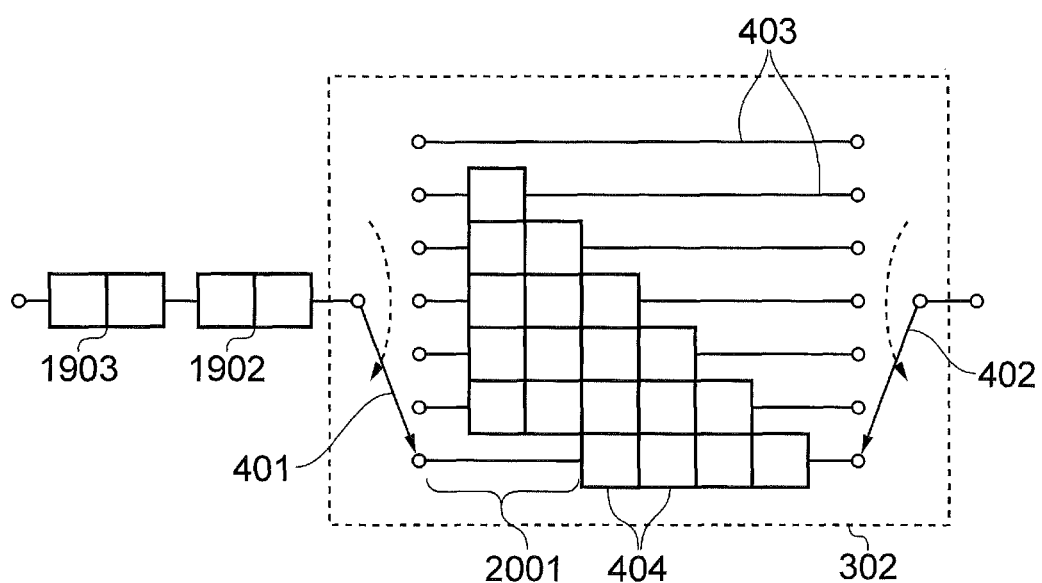
FIG. 20 provides a schematic diagram of a deinterleaver with a two-section input buffer in accordance with an embodiment of the present disclosure.

FIG. 20 illustrates the two section memory arrangement described above. The non-shifting memory 1903 is implemented using the free memory locations 2001 and the FIFO 1902 for the symbols of the current interleaving frame uses a separate dedicated buffer memory. If it is considered that a block interleaver uses 100% of a memory then a conventional convolution interleaver use 50%. However, the conventional convolutional interleaver will be unable to separate interleaving frames etc. without adversely affecting latency and capacity. Implementing a conventional interleaver with a buffer formed from vacant memory elements as in FIG. 11 allows interleaving frames to be separated and also uses 50% of the memory. However, it also requires complex memory reconfiguration. Utilising the two section memory configuration described above and illustrated in FIG. 20 greatly simplifies the operation of the deinterleaver memory when dealing with discontinuity punctures and interleaving frame separation but only requires $N_{max}$ more symbol memory. Consequently, a convolutional deinterleaver as described above is able to take account of interleaving frame separation and other discontinuities whilst using 62.5% of the memory of a block interleaver and avoiding complex memory management.

Restarting and Reconfiguration

At the time of outputting the last symbol from the current interleaving frame from the deinterleaver, the input buffer 1903 will contain $N_{addr}$ symbols from the next interleaving frame. These need to be input into the deinterleaver in the order shown in FIG. 13.

If the deinterleaver is implemented using, for example, flip-flops, then executing the filling process illustrated in FIG. 13 could be done using suitable multiplexing logic. If, however, the deinterleaver is implemented using a random access memory, a first method of executing the filling process illustrated in FIG. 13 is to read out the data from the input buffer symbol by symbol and to write this into the deinterleaver memory elements. However, in cases where the input buffer is implemented using memory locations released from the deinterleaver, care must be taken if following this method to ensure that data is not overwritten when executing the filling process illustrated in FIG. 13. Another disadvantage of that method is that reading and writing data symbol by symbol may take more time than is available. A second method of transferring the data from the input buffer to the deinterleaver memory, considering that they are both implemented using the same physical memory, is to execute the transfer instantaneously by changing the memory mapping of the memory. It turns out that this method is straightforward, because the entirety or second section of the input buffer is implemented using memory locations released from the deinterleaver in the order shown in FIG. 17. Comparing FIG. 13 and FIG. 17 shows that simply reversing the order of column numbering has the desired effect.

Figure 21:
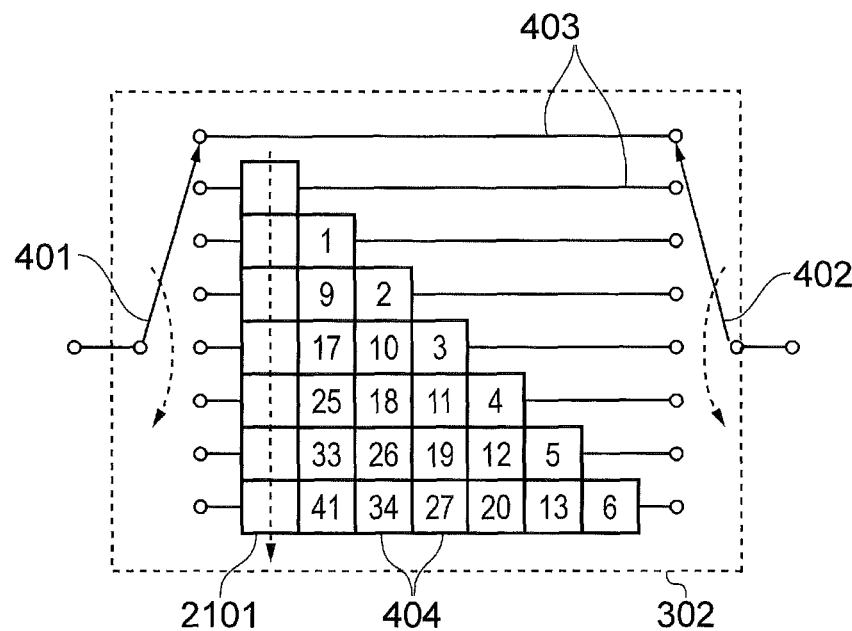
FIG. 21 provides a schematic diagram of a reconfigured deinterleaver in accordance with an embodiment of the present disclosure.

FIG. 21 illustrates the deinterleaver 302 when the shutting down and the starting up of the deinterleaver 302 is due to the reconfiguration of the interleaver 204 and deinterleaver 302. Reconfiguration may be required when the size of the interleaver 204 and deinterleaver 302 is to be altered. If the size of an interleaver 204 and a deinterleaver 302 is changed then there will necessarily be a change in the latency through them. The techniques described thus far are not likely to be able to be used to account for a change in latency caused by a change in the size of the interleaver 204 and deinterleaver 302, instead some other mechanism such as there being gaps in the transmitted data or there being a data smoothing buffer in the receiver is required.

For example in FIG. 21 the size of the deinterleaver 302 has been increased due to the addition of an extra column of memory elements 2101. In order to account for this increase, symbols are first input into the pre-existing memory elements 404 as set out above and then symbols are input into the remaining vacant memory elements in the order they are received and taking into account any subsequent discontinuities, discontinuity punctures, and symbols affected by discontinuity punctures.

Figure 22:
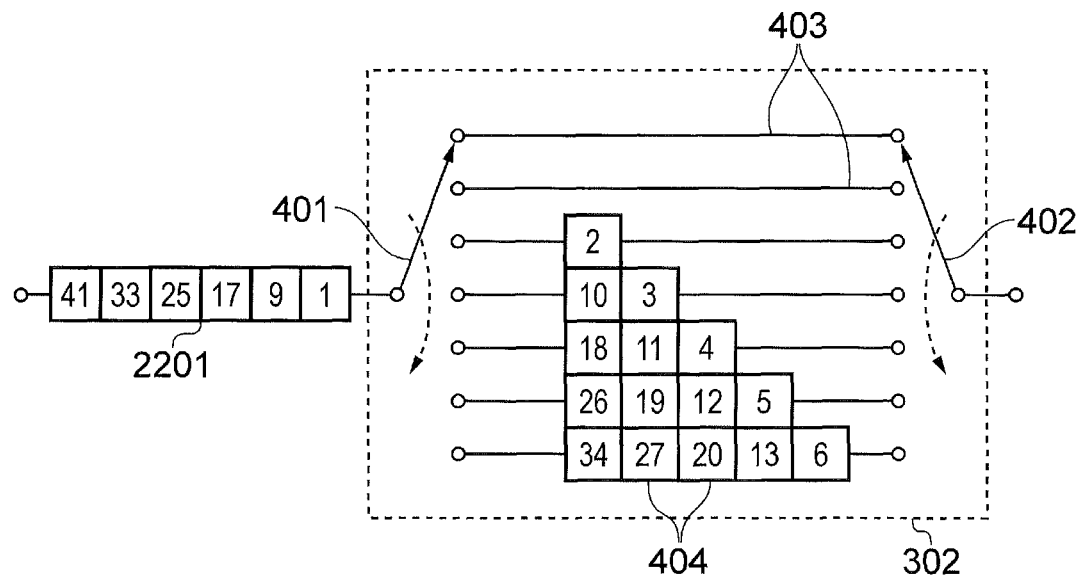
FIG. 22 provides a schematic diagram of a reconfigured deinterleaver in accordance with an embodiment of the present disclosure.

FIG. 22 illustrates the deinterleaver 302 when the size of the deinterleaver 302 has been reduced. The previously described technique for the input of symbols from the input buffer 701 can be utilised to fill the available memory elements 404 of the delay portions 403. However, remaining data must either be buffered upstream from the deinterleaver 302 or could be buffered by using the remaining and now unused memory locations associated with memory elements used as a buffer 2201.

Various modifications may be made to embodiments herein before described. For example, other memory management techniques may be used to implement the deinterleaver, the delay portions, memory elements, and the input buffer. The functional elements of the deinterleaver herein before described may also implemented using a variety of means, for instance the controller and memory management elements may be implemented as circuitry, circuits, parts of circuits, logic, processors or parts of processors. Similarly, the blocks of the transmitter and the receiver, the delay portions, memory elements, memory locations and section of the input buffer may be implemented using a variety of means for example, such as through a combination of volatile and non-volatile memory, circuitry, circuits or parts of circuits, logic, or processors or parts of processors. The described deinterleaving techniques may also be implemented in any suitable communications network or communications architecture.

The following numbered clauses provide further example aspects and features of the present technique:

1. A receiver for receiving a signal comprising an interleaved symbol stream, the receiver comprising:
   convolutional deinterleaver circuitry comprising a plurality of delay portions each of which is arranged to delay symbols from the symbol stream from an input to an output by a different amount, the delay portions being arranged in a sequence;
   an input selector configured to input the symbols from the symbol stream to the delay portions so that successive symbols are input in accordance with the sequence of the delay portions;
   an output selector configured to read the symbols from the delay portions by successively selecting the symbols from the outputs of the delay portions in accordance with the sequence of the delay portions to form a deinterleaved symbol stream;
   and
   controller circuitry configured
   to detect a discontinuity puncture in the interleaved symbol stream resulting from symbols being punctured from the interleaved symbol stream; and
   to identify symbols in the interleaved symbol stream affected by the discontinuity puncture, the identified symbols in the interleaved symbol stream being symbols which would be out of sequence in the deinterleaved symbol stream as a result of the discontinuity puncture,
   to store the identified symbols, and
   to input the identified symbols to the delay portions to compensate for the discontinuity, wherein at least one of the delay portions is formed from one or more memories and at least one of the identified symbols is stored in the one or more memories of the delay portions, which would have been occupied by the symbols which had been punctured from the interleaved symbol stream.

2. A receiver according to clause 1, wherein the symbols are input to and read out from the delay portions in a first direction in accordance with the sequence of delay portions and the controller is configured to determine a reference number ($N_{ref}$) for each symbol in the interleaved symbol stream, the reference number identifying the order in which the symbols should be read out to form the deinterleaved symbol stream, and the reference number is calculated in accordance with $$N_{ref}=(N_{iter}-N_{pors}+1)N_{pors}+(N_{pors}+1)N_{por}$$

where $N_{por}$ is a position of a delay portion relative to the other delay portions, $N_{pors}$ is the total number of delay portions and $N_{iter}$ represents a number of iterations through the sequence of delay portions.

3. A receiver according to clause 1, wherein the symbols are input to and read out from the delay portions in a second direction in accordance with the sequence of delay portions and the controller is configured to determine a reference number ($N_{ref}$) for each symbol in the interleaved symbol stream, the reference number identifying the order in which the symbols should be read out to form the deinterleaved symbol stream, and the reference number is calculated in accordance with $$N_{ref}=(N_{iter}-N_{por})N_{pors}+N_{por}$$

where $N_{por}$ is a position of a delay portion relative to the other delay portions, N is the total number delay portions and $N_{iter}$ represents the number of iterations through the sequence of delay portions.

4. A receiver according to clauses 2 or 3, wherein the controller is configured to detect a discontinuity puncture in accordance with $N_{ref}<0$ for the input symbol.

5. A receiver according to clauses 2 or 3, wherein the symbols of the interleaved symbol stream are divided into interleaving frames, the discontinuity punctures resulting from a transition between frames, and the controller is configured to detect a discontinuity puncture in accordance with $N_{ref} \geq N_{frame}$ for the input symbol, where $N_{frame}$ represents the number of symbols remaining in a current interleaving frame.

6. A receiver according to clause 5, wherein the symbols stored in the one or more memories of the delay portions which would have been occupied by symbols that have been punctured from the interleaved symbol stream, form the next interleaving frame.

7. A receiver according to clause 5 or 6, wherein the receiver comprises a buffer and one or more of the identified symbols that form part of the current frame are stored in the buffer, the buffer being formed from memories other than the memories of the delay portions.

8. A receiver according to clause 7, wherein $$N_{frame} \bmod N_{pors}=0.$$

9. The receiver according to clause 8, wherein the maximum size ($N_{max}$) of the buffer is given by $$N_{max} \sum_{k=1}^{floor\left(\frac{N_{pors}}{2}\right)} k.$$

10. The receiver according to any preceding claim, wherein the signal comprises synchronisation data indicating the position of the selectors, and the controller is configured detect the synchronisation data and to position the selectors in accordance with the synchronisation data.

The invention claimed is:

1. A receiver, comprising:
   circuitry configured to
      receive a sequence of QAM-mapped symbols interleaved in accordance with a convolutional interleaving;
      receive signaling data indicating a position, the position being an arbitrary value between 0 and n−1, the signaling data being applied to a physical layer frame including the received sequence of QAM mapped symbols and indicating a start position of a delay line selector of a convolutional deinterleaver, the convolutional deinterleaver including n delay lines, each delay line having k delay elements with k varying from 0 to n−1 wherein any two different delay lines, of the n delay lines, have a different number of delay elements; and
      in response to receiving the signaling, data, set the start position of the delay line selector of the convolutional deinterleaver to the arbitrary value indicated by the received signaling data to deinterleave the received sequence of QAM mapped symbols at a start of the physical layer frame.

2. The receiver as claimed in claim 1, wherein the circuitry is further configured to decode data from the received sequence of QAM-mapped symbols.

3. The receiver as claimed in claim 1, wherein the circuitry further comprises demapper circuitry configured to demap the received QAM-mapped symbols into forward error-correction encoded data.

4. The receiver as claimed in claim 1, wherein the convolutional deinterleaver is configured to write one QAM-mapped symbol of the received sequence to each of a plurality of delay elements.

5. The receiver as claimed in claim 1, wherein the received QAM-mapped symbols comprise bits mapped to a constellation point associated with 16QAM modulation or QPSK modulation.

6. The receiver as claimed in claim 1, wherein the convolutional deinterleaver further includes selectors, the selectors being configured to switch the delay lines to deinterleave the sequence of QAM-mapped symbols.

7. The receiver as claimed in claim 1, wherein the deinterleaved sequence comprises a plurality of blocks of FEC data.

8. The receiver as claimed in claim 1, wherein the circuitry includes the convolutional deinterleaver, which is configured to deinterleave the sequence of QAM-mapped symbols.

9. A television receiver, comprising:
   the receiver as claimed in claim 1, wherein the circuitry is further configured to process data decoded from the received sequence of QAM-mapped symbols into audio/video for display.

10. The receiver as claimed in claim 1, wherein the received sequence of QAM-mapped symbols does not include any dummy symbols.

11. The receiver of claim 1, wherein the signaling data received by the circuitry, and indicating the start position of the delay line selector, is indicated at a start of each frame.

12. A television set including the receiver of claim 1.

13. A method, comprising:
   receiving a sequence of QAM-mapped symbols having been interleaved in accordance with a convolutional interleaving;
   receiving signaling data indicating a position, the position being an arbitrary value between 0 and n−1, the signaling data being applied to a physical layer frame including the received sequence of QAM mapped symbols and indicating a the start position of a delay line selector of a convolutional deinterleaver, the convolutional deinterleaver including of n delay lines each delay line having a k delay elements with k varying from 0 to n−1, wherein any two different delay lines, of then delay lines, have a different number of delay elements; and
   in response to receiving the signalin data. setting the start position of the delay line selector of the convolutional deinterleaver to the arbitrary value indicated by the received signaling data to deinterleave, by circuitry, the received QAM mapped symbols at a start of the physical layer frame.

14. The method as claimed in claim 13, further comprising deinterleaving the received QAM mapped symbol by selecting a particular delay line among the n delay lines according to the set start position determined from the signalling data.

15. The method as claimed in claim 13, wherein the received sequence of QAM-mapped symbols does not include any dummy symbols.

16. The method of claim 13, wherein the signaling data indicating the start position of the delay line selector is indicated at a start of each frame.

17. A receiver, comprising:
   circuitry configured to
      receive a sequence of QAM-mapped symbols interleaved in accordance with a convolutional interleaving, the received sequence of QAM-mapped symbols being divided into blocks of forward error-correction encoded data;
      receive signaling data indicating a position, the position being an arbitrary value between 0 and n−1, the signaling data being applied to a physical layer frame including the received sequence of QAM mapped symbols and indicating a start position of a delay line selector of a convolutional deinterleaver. the convolutional deinterleaver including n delay lines, each delay line having k delay elements with k varying from 0 to n−1, wherein any two different delay lines, of the n delay lines, have a different number of delay elements;
      in response to receiving the signaling data, set the start position of the delay line selector of the convolutional deinterleaver to the arbitrary value indicated by the received signaling data; and
      deinterleave the received sequence of QAM mapped symbols at a start of the physical layer frame.

18. The receiver as claimed in claim 17, wherein the circuitry is further configured to synchronize forward error-correction circuitry with the deinterleaved QAM mapped symbols using the signaling data.

19. The receiver as claimed in claim 17, wherein the convolutional deintrleaver includes selectors, the selectors being configured to switch the delay lines to deinterleave the sequence of QAM-mapped symbols.

20. The receiver as claimed in claim 17, further comprising forward error-correction decoder circuitry configured to decode the blocks of forward error-correction encoded data.

21. A television receiver, comprising:
the receiver as claimed in claim 17, wherein the circuitry is further configured to process data decoded from the received sequence of QAM-mapped symbols into audio/video for display.

22. The receiver as claimed in claim 17, wherein the received sequence of QAM-mapped symbols does not include any dummy symbols.

23. The receiver of claim 17, wherein the signaling data received by the circuitry, and indicating the start position of the delay line selector, is indicated at a start of each frame.

24. A television set including the receiver of claim 17.

25. A method, comprising:
receiving a sequence of QAM-mapped symbols having been interleaved in accordance with a convolutional interleaving, the received sequence of QAM-mapped symbols being divided into blocks of forward error-correction encoded data;
receiving signaling data indicating a position the position being an arbitrary value between 0 and n−1, the signaling data being applied to a physical layer frame including the received sequence of QAM mapped symbols and indicating a start position of a delay line selector of a convolutional deinterleaver, the convolutional deinterleaver including n delay lines, each delay line having k delay elements with k varying from 0 to n−1, wherein any two different delay lines, of the n delay lines, have a different number of delay elements;
in response to receiving the signaling data, setting the start position of the delay line selector of the convolutional deinterleaver to the arbitrary value indicated by the received signaling data; and
deinterleaving the received sequence of QAM mapped symbols at a start of the physical layer frame.

26. The method as claimed in claim 25. further comprising forward error correction decoding the blocks of forward error-correction encoded data.

27. The method as claimed in claim 25, further comprising:
processing data decoded from the received sequence of QAM--mapped symbols into audio/video for display; and
displaying processed data.

28. The method as claimed in claim 25, wherein the received sequence of QAM-mapped symbols does not include any dummy symbols.

29. The method of claim 25, wherein the signaling data indicating the start position of the delay line selector is indicated at a start of each frame.

* * * * *

UNITED STATES PATENT AND TRADEMARK OFFICE
CERTIFICATE OF CORRECTION

| | | |
|---|---|---|
| PATENT NO. | : 11,303,304 B2 | |
| APPLICATION NO. | : 16/198921 | |
| DATED | : April 12, 2022 | |
| INVENTOR(S) | : Matthew Paul Athol Taylor | |

It is certified that error appears in the above-identified patent and that said Letters Patent is hereby corrected as shown below:

On the Title Page

Item (71), the Applicant's information is incorrect. Item (71) should read:
-- (71) Applicant: SATURN LICENSING LLC, New York, NY (US) --

Signed and Sealed this
Twenty-seventh Day of September, 2022

Katherine Kelly Vidal
*Director of the United States Patent and Trademark Office*